United States Patent
Shirato et al.

(10) Patent No.: US 9,714,468 B2
(45) Date of Patent: Jul. 25, 2017

(54) FILM-FORMING METHOD OF AN OSMIUM FILM

(71) Applicant: Daiwa Techno Systems Co., Ltd., Tokyo (JP)

(72) Inventors: Takeshi Shirato, Chiba (JP); Yuuji Honda, Chiba (JP); Hiroshi Sato, Tokyo (JP); Masamichi Osawa, Tokyo (JP)

(73) Assignee: DAIWA TECHNO SYSTEMS CO., LTD., Tokyo (JP)

( * ) Notice: Subject to any disclaimer, the term of this patent is extended or adjusted under 35 U.S.C. 154(b) by 363 days.

(21) Appl. No.: 14/446,705

(22) Filed: Jul. 30, 2014

(65) Prior Publication Data

US 2014/0335281 A1    Nov. 13, 2014

Related U.S. Application Data (62) Division of application No. 12/808,894, filed as application No. PCT/JP2008/073288 on Dec. 22, 2008, now abandoned.

(30) Foreign Application Priority Data

Dec. 21, 2007 (JP) .................................. 2007-329867

(51) Int. Cl.
  *C23C 16/505* (2006.01)
  *C23C 16/04* (2006.01)
  (Continued)

(52) U.S. Cl.
  CPC .......... *C23C 16/505* (2013.01); *C23C 16/045* (2013.01); *C23C 16/06* (2013.01);
  (Continued)

(58) Field of Classification Search
  None
  See application file for complete search history.

(56) References Cited

U.S. PATENT DOCUMENTS

| 4,485,759 A | 12/1984 | Brandolf |
| 5,354,412 A | 10/1994 | Suzuki et al. |

(Continued)

FOREIGN PATENT DOCUMENTS

| EP | 730266 | | 9/1996 |
| JP | 06-009223 | * | 6/1992 |

(Continued)

OTHER PUBLICATIONS

Akahori Journal of Electron Microscopy V49 No. 6 p. 735-744 2000.*

(Continued)

*Primary Examiner* — Joseph Miller, Jr.
(74) *Attorney, Agent, or Firm* — Wenderoth, Lind & Ponack, L.L.P.

(57) ABSTRACT

A film-forming method of an osmium film includes disposing a metal plate in a chamber; introducing $OsO_4$ gas at a flow rate of 0.1 to 3 cc/min and an inert gas for maintaining discharge into the chamber while maintaining the pressure in the chamber to 13 to 40 Pa; and forming an osmium film on the surface of the metal plate by turning the gas in the chamber into plasma using radio frequency output power with the density of 0.25 to 2.0 $W/cm^2$.

1 Claim, 7 Drawing Sheets

(51) Int. Cl.
  *C23C 16/06*   (2006.01)
  *C23C 16/455*  (2006.01)
  *C23C 16/458*  (2006.01)
  *C23C 16/509*  (2006.01)
  *H01J 37/32*   (2006.01)

(52) U.S. Cl.
  CPC .... *C23C 16/4587* (2013.01); *C23C 16/45591* (2013.01); *C23C 16/509* (2013.01); *H01J 37/32082* (2013.01); *H01J 37/32091* (2013.01); *H01J 37/32623* (2013.01); *H01J 37/32633* (2013.01); *H01J 37/32697* (2013.01); *H01J 37/32899* (2013.01); *Y10T 428/12361* (2015.01)

(56) References Cited

U.S. PATENT DOCUMENTS

| | | |
|---|---|---|
| 5,653,812 A | 8/1997 | Petrmichl et al. |
| 5,900,062 A | 5/1999 | Loewenhardt et al. |
| 6,178,919 B1 | 1/2001 | Li et al. |
| 6,506,009 B1 | 1/2003 | Nulman et al. |
| 7,045,465 B2 | 5/2006 | Ito et al. |
| 2003/0148040 A1 | 8/2003 | Satoh |

FOREIGN PATENT DOCUMENTS

| | | |
|---|---|---|
| JP | 6-9223 | 1/1994 |
| JP | 6-28992 | 2/1994 |
| JP | 6-16386 | 3/1994 |
| JP | 8-209352 | 8/1996 |
| JP | 2002-60941 | 2/2002 |
| JP | 2006-92765 | 4/2006 |

OTHER PUBLICATIONS

Hochido JP06-009223 Jun. 1992 Eng machine trans.*
Hamalainen Chem of Mat Dec. 2011 p. 55-60.*
International Search Report issued Mar. 17, 2009 in International (PCT) Application No. PCT/JP2008/073288.

* cited by examiner

FILM-FORMING METHOD OF AN OSMIUM FILM

TECHNICAL FIELD

The present invention relates to a film-forming treatment jig for forming a thin film on a plate having a through hole of a micro diameter by a single plasma film-forming treatment, a plasma CVD (Chemical Vapor Deposition) apparatus using the film-forming treatment jig, a metal plate, and an osmium film forming method.

BACKGROUND ART

Figure 8:
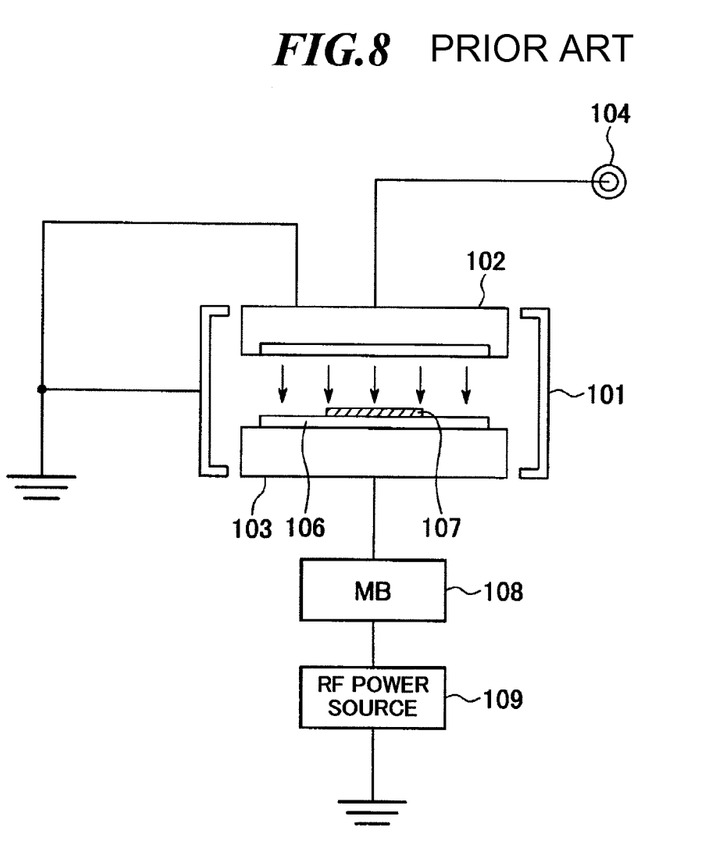
FIG. 8 is a cross-sectional view showing a conventional plasma CVD apparatus in outline.
Figure 9:
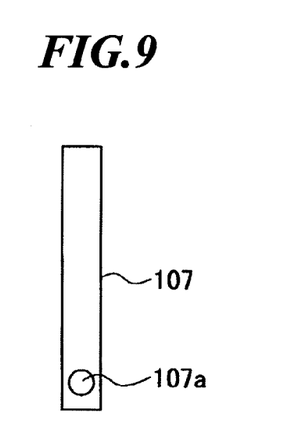
FIG. 9 is a plan view showing an aperture plate.

FIG. 8 is a cross-sectional view showing a conventional plasma CVD apparatus in outline. FIG. 9 is a front view showing an aperture plate. The aperture plate 107 is a component for narrowing an electron beam in an electron microscope. The plasma CVD apparatus shown in FIG. 8 is an apparatus for forming a metal film on the surface of the aperture plate 107.

As shown in FIG. 8, the conventional plasma CVD apparatus has a chamber 101, and, in the chamber 101, a gas shower electrode 102 as an upper electrode of a parallel flat plate type and a lower electrode 103 are arranged. The gas shower electrode 102 is connected to a raw material gas supply source 104. Moreover, the gas shower electrode 102 and the chamber 101 are connected to the ground potential.

On the lower electrode 103, a substrate 106 is placed, and on the substrate 106, the aperture plate 107 is attached. To the lower electrode 103, a radio frequency power source (RF power source) 109 is connected via a matching box 108.

The aperture plate 107 shown in FIG. 9 is a plate-like member having a thickness of 10 to 500 µm, and has a first through hole (a through hole for the attachment) 107a with a diameter of around 2 mm. Moreover, for the aperture plate 107, a plurality of second through holes (not shown) with a diameter of around 2 to 100 µm is arranged, wherein the second through hole is a hole for narrowing the electron beam in an electron microscope. The portions for which the formation of the metal film is necessary in the aperture plate 107 are a portion located near the second through hole on the front and back surfaces of the aperture plate, and the inside surface of the second through hole.

A method of forming the metal film on the aperture plate 107 using the above conventional plasma CVD apparatus is as follows.

On the substrate 106 such as a wafer, the aperture plate 107 is attached, and the substrate 106 is placed on the lower electrode 103 in the chamber 101. Subsequently, a raw material gas is supplied to the gas shower electrode 102 from the raw material gas supply source 104, and the raw material gas is ejected from the gas shower electrode 102 in a shower shape toward the lower electrode 103. Then, by outputting a radio frequency wave from the RF power source 109 to the lower electrode 103 via the matching box 108, a metal film is formed on the surface of the aperture plate 107 and the inside surface of the second through hole by a plasma CVD method.

After that, the substrate 106 is taken out of the chamber 101, the aperture plate 107 is peeled off from the substrate 106 and attached on the substrate 106 so that the other surface (the back surface) of the aperture plate 107 is exposed, and the substrate 106 is placed on the lower electrode 103 in the chamber 101. After that, by the same method as that for forming the metal film on the front surface of the aperture plate 107, the metal film is formed on the back surface of the aperture plate 107 and the inside surface of the second through hole.

SUMMARY OF THE INVENTION

In the above-mentioned conventional plasma CVD apparatus, in the case of a plate having a second through hole with a micro diameter such as an aperture plate, in order to form a thin film on the inside surface of the second through hole, and on a portion located near the second through hole on the front and back surfaces of the plate, as described above, a double film-forming treatment must be performed. Consequently, there was such a problem that the cost of the film-forming treatment for the plate becomes high. Moreover, when the double film-forming treatment is performed, an interface is necessarily formed between the first metal film formed by the first round of film-forming treatment and the second metal film formed by the second round of film-forming treatment, and, as the result, there occasionally arises such a problem that the peeling occurs at the interface of the first metal film and the second metal film.

On the other hand, there is such a proposal as forming an osmium film being the metal film on the front and back surfaces of the aperture plate and the inside surface of the second through hole. The osmium film has high resistance properties against an electron beam, and, therefore, it is expected to exert high performance as compared with other metal films.

In the above-described conventional plasma CVD apparatus of a parallel plate type, however, since plasma diffuses easily, heavy $OsO_4$ gas being a raw material gas for forming the osmium film hardly enters the second through hole of a micro diameter, and, as the result, the osmium film was not formed on the inside surface of the second through hole with good uniformity. In other words, even when the osmium film is formed on the inside surface of the second through hole by the conventional plasma CVD apparatus, the osmium film had low uniformity not to give, consequently, a high performance.

The present invention was achieved in view of the above circumstances, and an object thereof is to provide a film-forming treatment jig for forming a thin film on a plate having a through hole of a micro diameter by a single plasma film-forming treatment, and a plasma CVD apparatus using the film-forming treatment jig.

Another object of the present invention is to provide a metal plate having an osmium film formed on the inside surface of a through hole of a micro diameter with good uniformity.

Another object of the present invention is to provide a film-forming method of an osmium film for forming an osmium film on the surface of a metal member.

In order to solve the above problems, the film-forming treatment jig according to the present invention is a film-forming treatment jig including: a holding member for holding a plate, by clamping the plate having a through hole, in a state of exposing the through hole and the front and back surfaces of the plate; and an electrode member having the holding member attached thereon, wherein the electrode member is electrically connected to an electrode to which plasma electric power of a plasma CVD apparatus is applied.

According to the film-forming treatment jig, since it has a holding member for holding a plate, by clamping the plate having a through hole, in a state of exposing the through hole and the front and back surfaces of the plate, the formation of a thin film on the plate becomes possible by a single plasma film-forming treatment. Herewith, since the electrode member having the holding member attached thereon is one electrically connected to an electrode to which plasma electric power of a plasma CVD apparatus is applied, it is possible to make the electrode member function as a part of the electrode.

Moreover, in the film-forming treatment jig according to the present invention, the electrode member preferably has a flange used to be placed on a transfer arm.

The plasma CVD apparatus according to the present invention is a plasma CVD apparatus including:

a chamber, a first electrode disposed in the chamber, a second electrode disposed in the chamber, and disposed so as to face the first electrode, a power source electrically connected to at least one of the first electrode and the second electrode, for applying plasma electric power, a raw material gas introduction mechanism for introducing a raw material gas into the chamber, and a film-forming treatment jig including: a holding member for holding a plate, by clamping the plate having a through hole, in a state of exposing the through hole and the front and back surfaces of the plate; and an electrode member having the holding member attached thereon, wherein the electrode member functions as a part of the second electrode when a thin film is formed on the front and back surfaces of the plate held by the holding member and the inside surface of the through hole by a plasma CVD method, by electrically connecting the electrode member onto the second electrode and placing the plate held by the holding member between the first electrode and the second electrode.

Moreover, in the plasma CVD apparatus according to the present invention, it is also possible that the electrode member has a flange, and the apparatus comprises a transfer mechanism for transferring the film-forming treatment jig into the chamber by placing the flange on a transfer arm.

Moreover, it is preferable that the plasma CVD apparatus according to the present invention further includes a plasma wall arranged around the plate arranged in the chamber and placed between the first electrode and the second electrode, and that the plasma wall is connected to a float potential. This makes it possible to concentrate the flow of the raw material gas introduced into the chamber around the plate by the plasma wall, and also to confine the plasma around the plate by the plasma wall to raise the plasma density.

Moreover, in the plasma CVD apparatus according to the present invention, it is preferable to introduce the raw material gas by the raw material gas introduction mechanism in a direction approximately parallel to the surface of the plate placed between the first electrode and the second electrode.

The plasma CVD apparatus according to the present invention is a plasma CVD apparatus including:

a chamber;

an upper electrode disposed in the chamber;

a lower electrode disposed in the chamber, and disposed so as to face the upper electrode, on the lower side;

a power source electrically connected to at least one of the upper electrode and the lower electrode to apply plasma electric power;

a raw material gas introduction mechanism for introducing a raw material gas into the chamber, and for causing the raw material gas to flow from the upper electrode side toward the lower electrode side;

a film-forming treatment jig including: a holding member for holding a plate, by clamping the plate having a through hole, in a state of exposing the through hole and the front and back surfaces of the plate; an electrode member having the holding member attached thereon; and a flange provided to the electrode member;

a transfer mechanism for transferring the film-forming treatment jig into the chamber by placing the flange on a transfer arm, wherein the electrode member functions as a part of the second electrode when a thin film is formed on the front and back surfaces of the plate held by the holding member and the inside surface of the through hole by a plasma CVD method, by electrically connecting the electrode member onto the lower electrode, and placing the plate held by the holding member between the upper electrode and the lower electrode and placing the plate so that the surface thereof becomes approximately parallel to the direction vertical to the upper surface of the lower electrode.

Moreover, in the plasma CVD apparatus according to the present invention, it is preferable that the plate is an aperture plate, that the through hole has a diameter of 100 μm or less, and that the thin film is an osmium film.

Furthermore, in the plasma CVD apparatus according to the present invention, the plasma electric power is preferably radio frequency power.

The metal plate according to the present invention is a metal plate including a plate having a through hole with a diameter of 100 μm or less, and an osmium film formed by a single film-forming treatment by a plasma CVD apparatus, on the inside surface of the through hole and on the front and back surfaces located near the through hole of the plate, wherein the plasma CVD apparatus comprises:

a chamber, an upper electrode disposed in the chamber;

a lower electrode disposed in the chamber, and disposed so as to face the upper electrode, on the lower side;

a power source electrically connected to at least one of the upper electrode and the lower electrode to apply plasma electric power;

a holding member electrically connected to the lower electrode, for holding the plate in a state of exposing the through hole and the front and back surfaces of the plate by clamping the plate to place the plate between the upper electrode and the lower electrode;

a plasma wall arranged in the chamber, placed around the plate, and connected to a float potential; and a raw material gas introduction mechanism for introducing a raw material gas into the chamber, for causing the raw material gas to flow from the upper electrode side toward the lower electrode side, and for causing the raw material gas to flow in a direction along the front and back surfaces of the plate.

According to the metal plate, the osmium film can be formed on the inside surface of the through hole of a micro diameter with better uniformity as compared with conventional techniques, and, since the osmium film is formed by a single film-forming treatment, the interface as is the case for a film formed by multiple treatments does not generate in the osmium film.

In the metal plate according to the present invention, the thickness of the osmium film is preferably from 10 nm to 50 nm, inclusive.

In the metal plate according to the present invention, the plasma electric power is preferably radio frequency power.

In the metal plate according to the present invention, the metal plate may also be an aperture plate.

The film-forming method of an osmium film according to the present invention is characterized by including the steps of:

disposing a metal member in a chamber;

introducing $OsO_4$ gas at a flow rate of 0.1 to 3 cc/min and an inert gas for maintaining discharge into the chamber while maintaining the pressure in the chamber to 13 to 40 Pa; and forming an osmium film on the surface of the metal member by turning the gas in the chamber into plasma using radio frequency output power with the density of 0.25 to 2.0 $W/cm^2$.

Meanwhile, into the chamber, $H_2$ gas at a flow rate of 5 to 15 cc/min may be introduced, and the metal member may be heated to a temperature of 200 to 300° C. to form the film. The metal member may also be a metal plate. The inert gas may also be He or Ar.

According to the film-forming method of an osmium film, by using RF discharge by radio frequency output power, and defining each range of the radio frequency output power density, and $OsO_4$ gas and pressure, the remaining of oxygen contained in the raw material gas in the osmium film formed on the metal member can be suppressed. The osmium film has such properties as resistant to electron beams.

In contrast, when DC discharge is used to form an osmium film on the surface of the metal member, in the osmium film, oxygen in the raw material gas easily remains and suppressing the remaining of the oxygen is difficult. Osmium films in which the oxygen remains in this manner have such defect as not resistant to electron beams.

The reason why the above-described difference between the RF discharge and the DC discharge is generated is considered that the case of the RF discharge gives a stable discharge to enable the suppression of the remaining of the oxygen contained in the raw material gas, but that the case of the DC discharge gives an unstable discharge not to allow the suppression of the remaining of the oxygen contained in the raw material gas.

As described above, according to the present invention, it is possible to provide a film-forming treatment jig for forming a thin film for a plate having a through hole of a micro diameter by a single plasma film-forming treatment, and a plasma CVD apparatus using the film-forming treatment jig.

Moreover, according to another present invention, it is possible to provide an aperture plate in which an osmium film is formed on the inside surface of the through hole of a micro diameter with good uniformity.

Furthermore, according to another present invention, it is possible to provide a film-forming method of an osmium film for forming an osmium film on the surface of a metal member.

DESCRIPTION OF REFERENCE NUMERALS AND SYMBOLS

1: cleaning chamber, 2: film-forming chamber, 3: first transfer mechanism, 4: second transfer mechanism, 5: transfer chamber, 6: first gate, 7: second gate, 8: film-forming treatment jig, 9: cover, 10: placement table, 11: vertical movement mechanism, 11a: placement portion, 11b: movement mechanism, 12: outer chamber, 13: inner chamber, 14: gas shower electrode, 15 to 22: pipe, 23 to 26: bulb, 27, 28: mass flow controller (MFC), 29: hydrogen gas supply source, 30: $OsO_4$ gas supply source, 31: heater, 32: lower electrode, 33: matching box, 34: radio frequency power source (RF power source), 35: vertical movement mechanism, 36: arrow, 37: plasma wall, 37a: cylindrical rectification member, 37b: ring-shaped rectification member, 37c: cylindrical rectification member, 38: film-forming position, 39: holding member, 49: flange member, 49a: columnar member, 49b: flange, 52 to 55: positioning portion, 60: float potential, 101: chamber, 102: gas shower electrode, 103: lower electrode, 104: raw material gas supply source, 106: substrate, 107: aperture plate, 107a: first through hole, 107b: through hole of a micro diameter (second through hole), 108: matching box, 109: radio frequency power source (RF power source), 110: osmium film

DETAILED DESCRIPTION OF THE INVENTION

Hereinafter, Examples of the present invention will be described with reference to the drawings.

Figure 1:
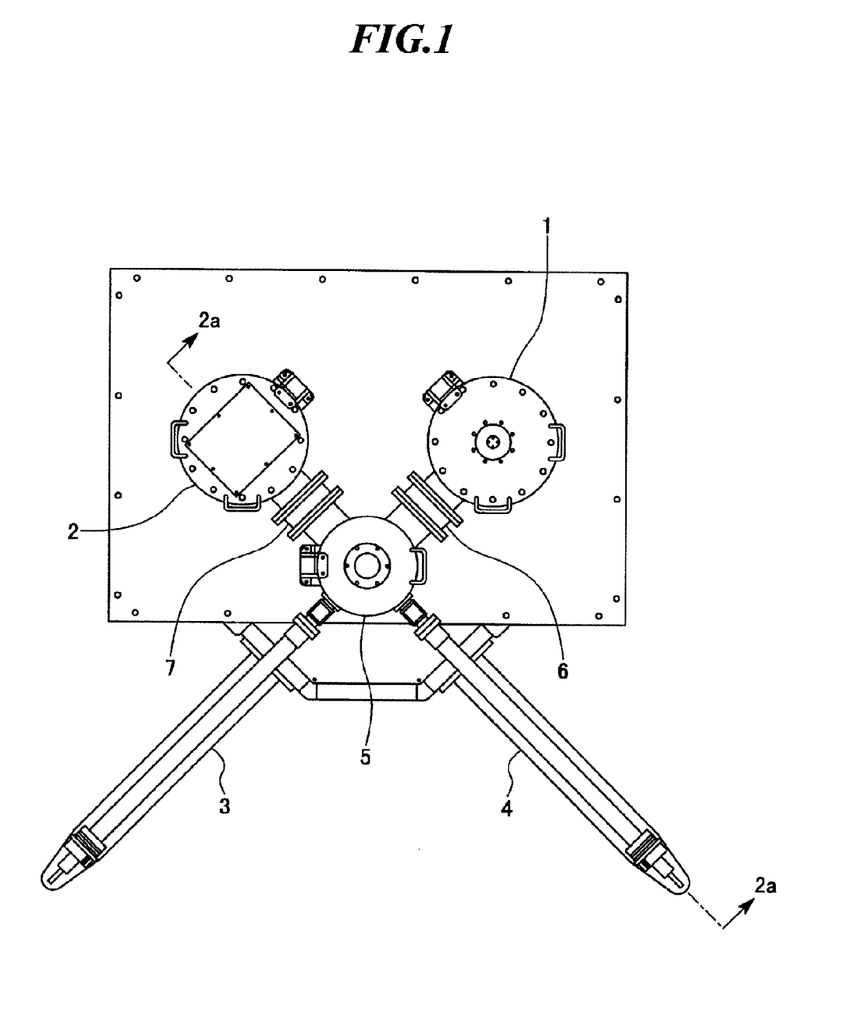
FIG. 1 is a plan view showing the whole constitution of a plasma CVD apparatus according to an Example according to the present invention.
Figure 2:
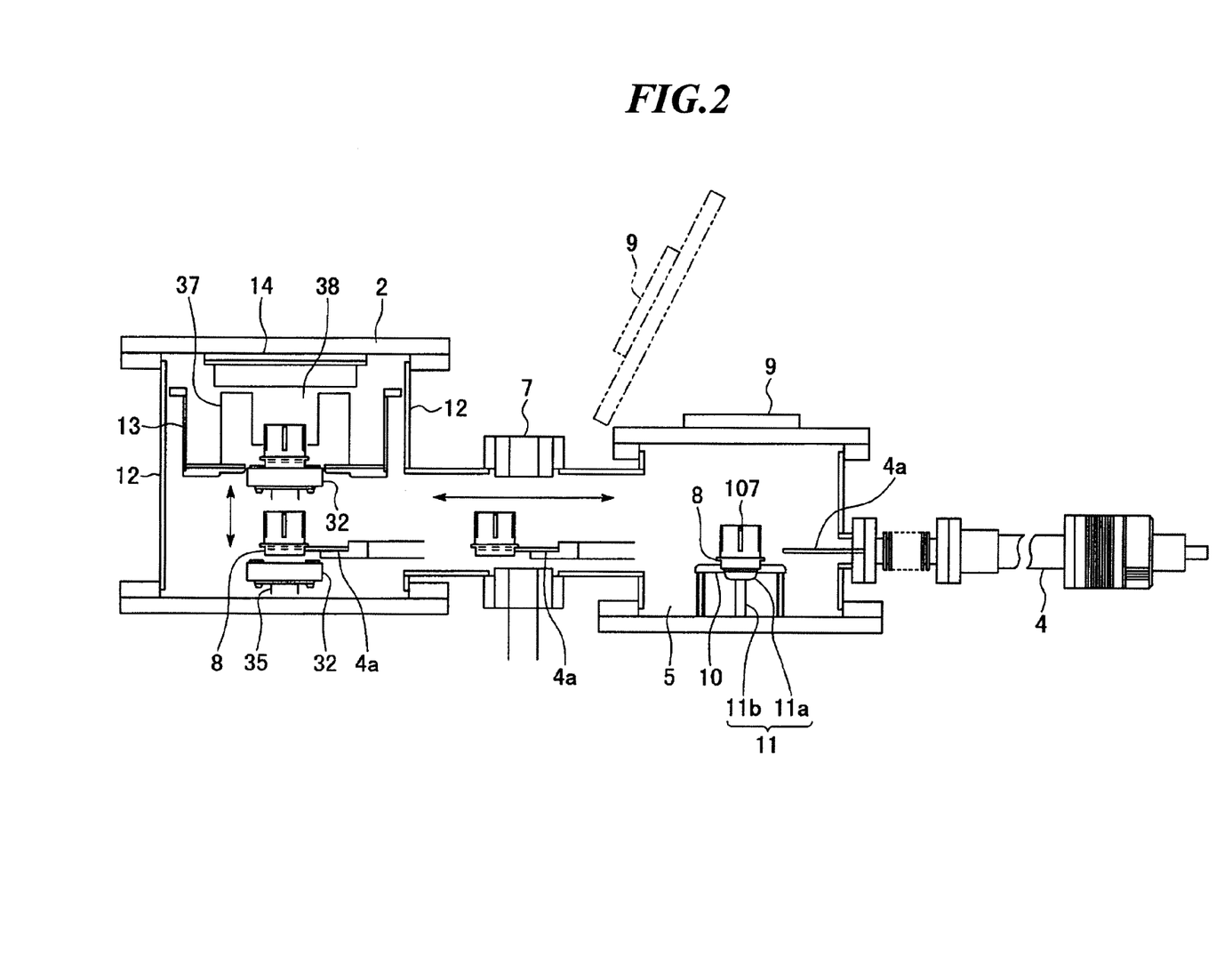
FIG. 2 is a cross-sectional view along the 2a-2a line shown in FIG. 1.
Figure 3:
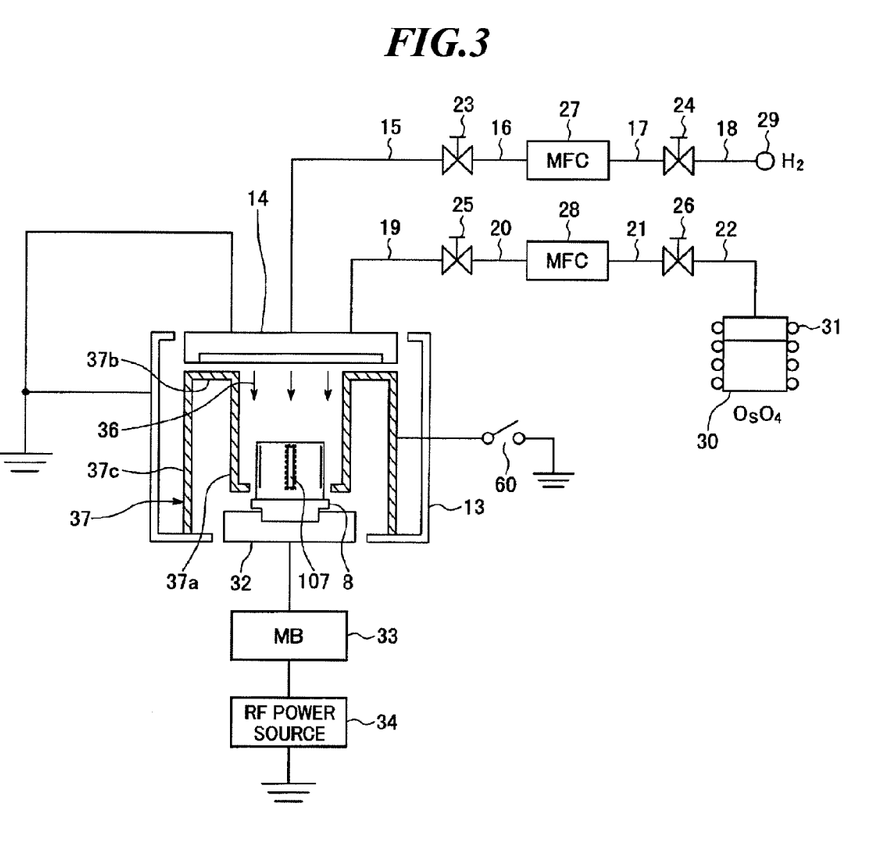
FIG. 3 is a cross-sectional view schematically showing the film-forming chamber, the plasma power source and the raw material gas supply mechanism shown in FIG. 2.

FIG. 1 is a plan view showing the whole constitution of a plasma CVD apparatus by an Example according to the present invention. FIG. 2 is a cross-sectional view along the 2a-2a line shown in FIG. 1. FIG. 3 is a cross-sectional view schematically showing the film-forming chamber, the plasma power source and the raw material gas supply mechanism shown in FIG. 2.

As shown in FIGS. 1 and 2, the plasma CVD apparatus has a cleaning chamber 1 and a film-forming chamber 2. The cleaning chamber 1 is connected to a transfer chamber 5 via a first gate 6, and the transfer chamber 5 is connected to a first transfer mechanism 3. When a film-forming treatment jig 8 holding an aperture plate 107 is inserted into the transfer chamber 5, the first transfer mechanism 3 is one that transfers the film-forming treatment jig 8 in the transfer chamber 5 toward the lower side of the cleaning chamber 1 through the opened first gate 6. Moreover, the film-forming chamber 2 is connected to the transfer chamber 5 via a second gate 7, and the transfer chamber 5 is connected to a second transfer mechanism 4. The second transfer mechanism 4 is one for transferring the film-forming treatment jig 8 in the transfer chamber 5 toward the lower side of the film-forming chamber 2 through the opened second gate 7.

The transfer chamber 5, the film-forming chamber 2 and the periphery thereof will be described in detail with reference to FIGS. 2 and 3.

As shown in FIG. 2, the transfer chamber 5 has a freely openable and closable cover 9. In the transfer chamber 5, a placement table 10 for placing the film-forming treatment jig 8, and a vertical movement mechanism 11 for vertically moving the film-forming treatment jig 8 placed on the placement table 10 are arranged. The vertical movement mechanism 11 has a placement portion 11a for placing the film-forming treatment jig 8, and a movement mechanism 11b for vertically moving the placement portion 11a. Moreover, to the transfer chamber 5, an evacuation mechanism such as a vacuum pump is connected, and is constituted to evacuate the inside of the transfer chamber 5 by the evacuation mechanism. Meanwhile, the insertion of the film-forming treatment jig 8 holding the aperture plate 107 into the transfer chamber 5 is performed by opening the cover 9 in a state where the second gate 7 is closed, placing the film-forming treatment jig 8 holding the aperture plate 107 on the placement table 10, and, after that, closing the cover 9.

As shown in FIG. 2, the film-forming chamber 2 has an outer chamber 12, and the outer chamber 12 is connected to the transfer chamber 5 via the freely openable and closable second gate 7. Moreover, to the outer chamber 12, such an evacuation mechanism as a vacuum pump is connected, and it is constituted so that the inside of the outer chamber 12 can be evacuated by the evacuation mechanism.

As shown in FIGS. 2 and 3, inside the outer chamber 12, an inner chamber 13 is disposed. At the upper portion of the inner chamber 13, a gas shower electrode 14 as an upper electrode is arranged. To the gas shower electrode 14, a first gas supply mechanism for supplying hydrogen gas and a second gas supply mechanism for supplying $OsO_4$ gas are connected.

The first gas supply mechanism has a hydrogen gas supply source 29, and, to the hydrogen gas supply source 29, one end of a pipe 18 is connected. To the other end of the pipe 18, one end of a bulb 24 is connected, and, to the other end of the bulb 24, one end of a pipe 17 is connected. To the other end of the pipe 17, one end of a mass flow controller (MFC) 27 is connected, and, to the other end of the mass flow controller 27, one end of a pipe 16 is connected. To the other end of the pipe 16, one end of a bulb 23 is connected, and, to the other end of the bulb 23, one end of a pipe 15 is connected. To the other end of the pipe 15, the gas shower electrode 14 is connected.

The second gas supply mechanism has an $OsO_4$ gas supply source 30, and, to the $OsO_4$ gas supply source 30, one end of a pipe 22 is connected. To the other end of the pipe 22, one end of a bulb 26 is connected, and, to the other end of the bulb 26, one end of a pipe 21 is connected. To the other end of the pipe 21, one end of a mass flow controller (MFC) 28 is connected, and, to the other end of the mass flow controller 28, one end of a pipe 20 is connected. To the other end of the pipe 20, one end of a bulb 25 is connected, and, to the other end of the bulb 25, one end of a pipe 19 is connected. To the other end of the pipe 19, the gas shower electrode 14 is connected. The $OsO_4$ gas supply source 30 has a heater 31, and it is constituted so that the heater 31 heats and sublimates solid $OsO_4$ to generate $OsO_4$ gas. It is also constituted so that each of pipes 19 to 21, bulbs 25 and 26, and the mass flow controller 28 is heated by a heater (not shown) to around 80° C. This makes it possible to introduce the $OsO_4$ gas generated by the $OsO_4$ gas supply source 30 into the gas shower electrode 14 without the solidification.

The gas shower electrode 14, the inner chamber 13 and the outer chamber 12 are connected to the ground potential.

On the lower side of the inner chamber 13, a lower electrode 32 is arranged, and, to the lower electrode 32, a radio frequency power source (RF power source) 34 is connected via a matching box 33. The radio frequency power source may use a frequency in the range of 100 kHz to 27 MHz.

Further, as shown in FIG. 2, the apparatus has a vertical movement mechanism 35 for vertically moving the lower electrode 32 between the lower portion of the outer chamber 12 and the lower portion of the inner chamber 13. In such a state that the vertical movement mechanism 35 has moved the lower electrode 32 to the lower side of the outer chamber 12, a transfer arm 4a of the second transfer mechanism 4 holds the film-forming treatment jig 8 in the transfer chamber 5, the transfer arm 4a moves the film-forming treatment jig 8 through the opened second gate 7 to the lower side of the outer chamber 12, and the film-forming treatment jig 8 is placed on the lower electrode 32 to be attached or engaged or electrically connected thereto. Then, the transfer arm 4a is returned into the transfer chamber 5, and the second gate 7 is closed. The vertical movement mechanism 35 raises the lower electrode 32 having the film-forming treatment jig 8 attached thereon to move the lower electrode 32 from the lower side of the outer chamber 12 to the lower portion of the inner chamber 13, and, thereby, the film-forming treatment jig 8 electrically connected to the lower electrode 32 is disposed in the inner chamber 13. As described above, the aperture plate 107 is arranged between the gas shower electrode 14 and the lower electrode 32, and is placed approximately parallel to the direction (shown by an arrow 36) in which the raw material gas is ejected in a shower shape from the gas shower electrode 14. The position is a film-forming position 38 when the aperture plate 107 is film-formed.

The film-forming treatment jig 8 is formed, for example, from SUS, and functions also as a part of the lower electrode. Consequently, when radio frequency power is applied to the lower electrode 32 from the RF power source 34 through the matching box 33, the radio frequency power is applied to the aperture plate 107 through the film-forming treatment jig 8. Meanwhile, the specific structure of the film-forming treatment jig 8, the holding method for holding the aperture plate 107 and the like will be described later.

As shown in FIG. 3, around the aperture plate 107 in the inner chamber 13, a plasma wall 37 made of ceramics or quartz or glass is arranged. The plasma wall 37 has a role of rectifying the flow of the raw material gas introduced from the gas shower electrode 14 so as to concentrate around the aperture plate 107, and a role of confining the plasma around the aperture plate 107 to raise the plasma density. Only when the plasma wall 37 can fulfill the role, the shape and the material thereof are changeable, and, in the Example, the shape as shown in FIG. 3 is adopted.

That is, the plasma wall 37 has a cylindrical rectification member 37a and a ring-shaped rectification member 37b for controlling the flow of the raw material gas, and a cylindrical rectification member 37c arranged outside the cylindrical rectification member 37a to suppress the discharge between the inner chamber wall and the outer chamber wall. Each upper portion of the cylindrical rectification members 37a and 37c is connected by the ring-shaped rectification member 37b. And, the plasma wall 37 is connected to a float potential 60. By the ring-shaped rectification member 37b and the cylindrical rectification member 37a, it is possible to concentrate the raw material gas from the gas shower electrode 14 around the aperture plate 107, and, as the result, to improve the use efficiency of the raw material gas. Moreover, by the cylindrical rectification member 37c, it is possible to suppress the diffusion of the plasma and to raise the plasma density, and to stabilize the discharge around the aperture plate 107.

Figure 4:
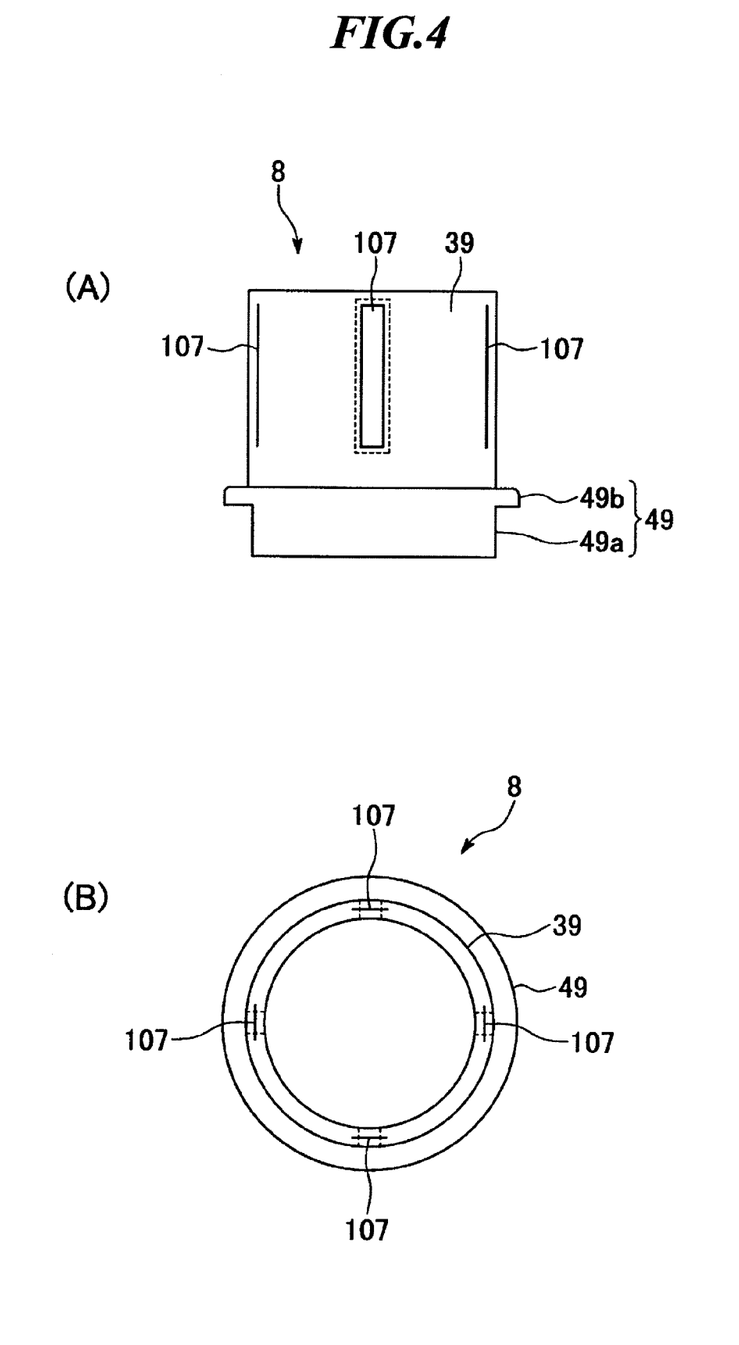
FIG. 4(A) is a side view showing a film-forming treatment jig holding an aperture plate.
FIG. 4(B) is a top view of the film-forming treatment jig shown in FIG. 4(A).
Figure 5:
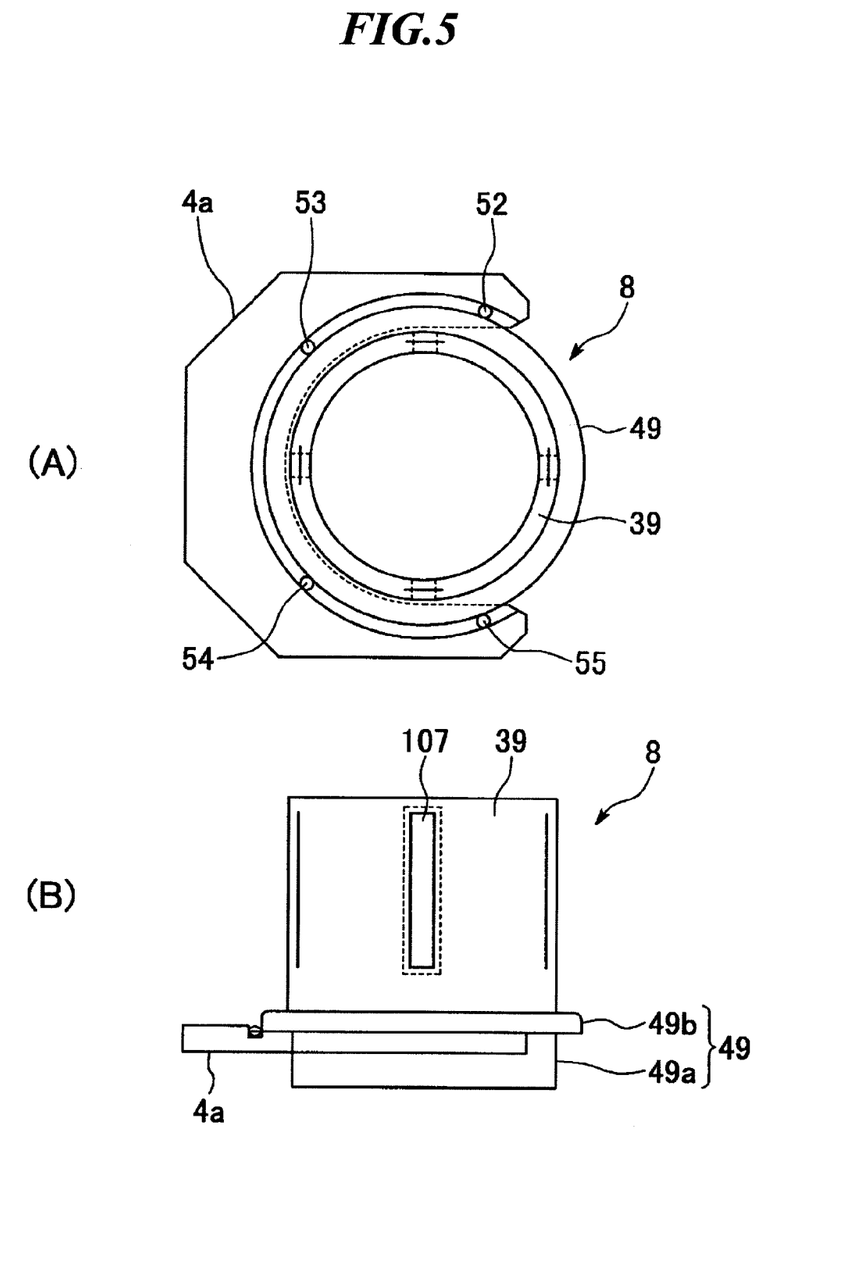
FIG. 5(A) is a drawing showing the situation when the film-forming treatment jig is transferred, and a plan view showing the state in which the film-forming treatment jig is placed on the transfer arm.
FIG. 5(B) is a side view showing the film-forming treatment jig and the transfer arm shown in FIG. 5(A).

Next, the specific structure of the film-forming treatment jig 8, the method of holding the aperture plate 107 thereto and the like will be described with reference to FIGS. 4 and 5.

FIG. 4(A) is a front view showing the film-forming treatment jig holding the aperture plate, and FIG. 4(B) is a plan view showing the film-forming treatment jig shown in FIG. 4(A). FIG. 5(A) is a drawing showing the situation when the film-forming treatment jig is transferred and a plan view showing the state where the film-forming treatment jig is placed on the transfer arm, and FIG. 5(B) is a front view showing the film-forming treatment jig and the transfer arm shown in FIG. 5(A).

As shown in FIGS. 4(A) and 4(B), the holding member 39 has a cylindrical shape. The holding member 39 holds four aperture plates 107 in a state of clamping the flange. The holding state is a state wherein the second through hole (the through hole of a micro diameter described in FIG. 9), and the front and back surfaces of the aperture plate 107 are exposed.

The holding member 39 is attached to a flange member 49. This makes it possible to hold each of the four aperture plates 107 held by the holding member 39 in a state of erecting each of them in the vertical direction relative to the upper surface of the flange member 49. The flange member 49 has, as shown in FIG. 4(A), a columnar member 49a and a flange 49b of a convex shape provided around the upper portion of the columnar member 49a. The flange 49b is one to be placed on the transfer arm 4a as shown in FIGS. 5(A) and 5(B). That is, by locating the transfer arm 4a around the columnar member 49a, and placing the flange 49b on the transfer arm 4a while positioning the flange 49b by the positioning portions 52 to 55, the state is set so that the film-forming treatment jig 8 may be transferred by the transfer arm 4a. Meanwhile, when the film-forming treatment jig 8 is connected to the lower electrode 32 shown in FIG. 3, the flange member 49 becomes an electrode member and functions as a part of the lower electrode.

Next, the method of forming an osmium film for the aperture plate using the above-described plasma CVD apparatus will be described.

Firstly, as shown in FIGS. 4(A) and 4(B), four aperture plates 107 are held by the holding member 39 of the film-forming treatment jig 8, and, as shown in FIGS. 2 and FIGS. 5(A) and 5(B), the movement mechanism 11b is raised to place the film-forming treatment jig 8 placed on the placement table 10 on the placement portion 11a. Then, the movement mechanism 11b is further raised to move the transfer arm 4a to the lower side of the film-forming treatment jig 8 placed on the placement portion 11a. After that, by lowering the movement mechanism 11b to lower the film-forming treatment jig 8 along with the placement portion 11a, the flange 49b of the film-forming treatment jig 8 is placed on the transfer arm 4a. As described above, the film-forming treatment jig 8 is placed on the transfer arm 4a, to set such a state that the film-forming treatment jig 8 may be transferred by the transfer arm 4a. After that, the film-forming treatment jig 8 is transferred from the transfer chamber 5 to the cleaning chamber 1 by the first transfer mechanism 3, and the aperture plate 107 is subjected to a cleaning treatment. After that, the film-forming treatment jig 8 is transferred from the cleaning chamber 1 to the transfer chamber 5 by the first transfer mechanism 3.

Subsequently, as shown in FIG. 2, the state is set so that the film-forming treatment jig 8 may be transferred by the transfer arm 4a, the film-forming treatment jig 8 is transferred by the second transfer mechanism 4 from the transfer chamber 5 to the film-forming chamber 2, and the film-forming treatment jig 8 is positioned at the film-forming position 38.

Next, as shown in FIG. 3, the first gas supply mechanism and the second gas supply mechanism supply hydrogen gas and $OsO_4$ gas to the gas shower electrode 14, and the hydrogen gas and the $OsO_4$ gas are supplied from the gas shower electrode 14 toward the aperture plate 107. On this occasion, the reason why the raw material gas is flown from top to bottom (in the gravity direction) as the arrow 36 is that the $OsO_4$ gas has a large molecular weight. Conversely, in the case of a raw material gas having a small molecular weight, if the gas may be supplied to the front and back surfaces of the aperture plate with good uniformity, it is not necessarily flown from top to bottom, and the direction of flowing the raw material gas may appropriately be changed.

After that, by supplying radio frequency power to the lower electrode 32 by the RF power source 34 to apply the radio frequency power to the aperture plate 107, an osmium film having a thickness of 10 nm or more is formed on the front and back surfaces of the aperture plate 107 and the inside surface of the second through hole (the through hole of a micro diameter described in FIG. 9) by a single film-forming treatment with good uniformity by a plasma CVD method. The chemical reaction on this occasion is as follows, wherein, as shown in formulae (1) and (2) below, the gas is ionized in the plasma and the film-forming reaction in the formula (3) below occurs on the aperture plate.

$$H_2 + 2e^- \rightarrow 2H^+ + 4e^- \tag{1}$$

$$OsO_4 + e^- \rightarrow OsO_4^+ + 2e^- \tag{2}$$

$$OsO_4^+ + 8H^+ + 9e^- \rightarrow Os\downarrow + 4H_2O\uparrow \tag{3}$$

The reason why the osmium film is to be formed for the aperture plate 107 is that osmium film has higher resistance properties against an electron beam as compared with other metal films to actualize long life, and enables the focusing properties of an electron beam to rise.

According to the above Example, since the film-forming treatment jig 8 has the aforementioned structure, as shown in FIG. 2, it is possible to transfer the film-forming treatment jig 8 by the transfer arm 4a, and to attach or fit the transferred film-forming treatment jig 8 on or in the lower electrode 32. Then, since the film-forming treatment jig 8 attached to the lower electrode 32 functions also as a lower electrode, as shown in FIG. 3, by supplying radio frequency power to the lower electrode 32, the radio frequency power can be applied to the aperture plate 107 through the film-forming treatment jig 8. Further, the holding member 39 of the film-forming treatment jig 8 can hold the aperture plate 107 in a state of exposing the front and back surfaces thereof. Consequently, by performing a single film-forming treatment with the plasma CVD apparatus, it is possible to form an osmium film, for a plate having a through hole of a micro diameter such as the aperture plate 107 (one explained as the second through hole in FIG. 9), on the inside surface of the through hole and the portion located near the through hole on the front and back surfaces of the plate. Accordingly, the treatment time of the film-forming treatment for the plate can be reduced, and, as the result, the cost of the film-forming treatment can be lowered.

Additionally, in the Example, since the plasma wall 37 connected to the float potential 60 is arranged around the aperture plate 107, it is possible to concentrate the raw material gas from the gas shower electrode 14 around the aperture plate 107, and to suppress the diffusion of the plasma and to concentrate the plasma for the aperture plate 107 to raise the plasma density. Consequently, even when a raw material gas for the film-forming that has a large molecular weight and is heavy such as $OsO_4$ gas is used, the osmium film can be formed on the inside surface of the through hole of a micro diameter with good uniformity.

Figure 6:
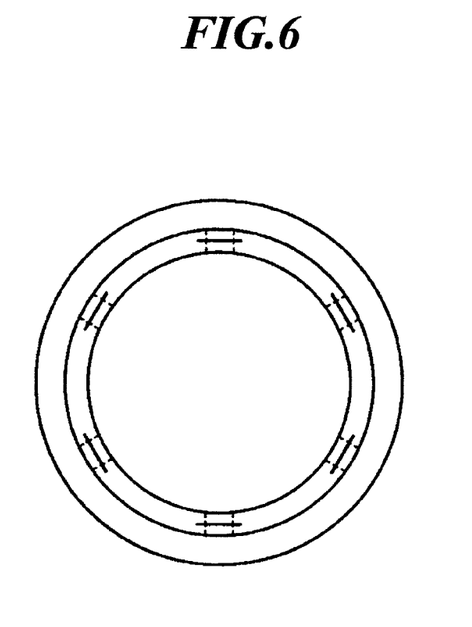
FIG. 6 is a plan view showing a modified example of the film-forming treatment jig holding the aperture plate.

Meanwhile, the present invention is not limited to the above Example, but may be practiced in variously changed modes within the scope not deviating from the gist of the present invention. For example, as shown in FIG. 6, the holding member 39 of the film-forming treatment jig may be so constituted as holding six aperture plates 107.

Further, in the above Example, the lower electrode 32 is connected to the radio frequency power source 34, and the upper electrode 14 is connected to the ground potential, but the upper electrode 14 may be connected to the radio frequency power source and the lower electrode 32 may be connected to the ground potential, or the upper electrode 14 may be connected to a first radio frequency power source and the lower electrode 32 may be connected to a second radio frequency power source. Furthermore, the radio frequency power source may be changed to another plasma power source. Examples of other plasma power sources include a power source for micro wave, a power source for DC discharge, and each of the pulse-modulated radio frequency power source, power source for micro wave and power source for DC discharge.

In the above Example, electrodes are arranged vertically such as the upper electrode 14 and the lower electrode 32, but the arrangement is not limited to this, and electrodes may be arranged from side to side.

Next, there are explained conditions and results of the experiment of forming an osmium film for the aperture plate having a through hole of a micro diameter using the plasma CVD apparatus according to the above Example.

Figure 7:
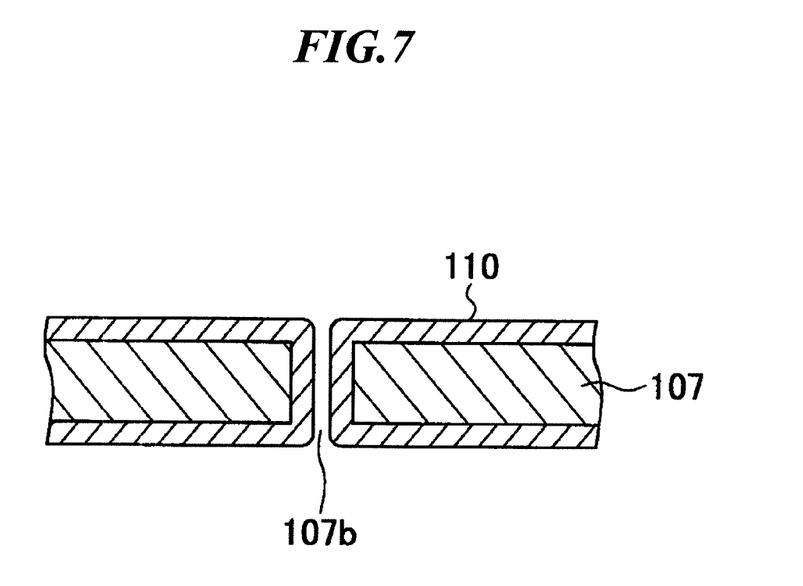
FIG. 7 is a cross-sectional view obtained by cutting the vicinity of the through hole of a micro diameter of the aperture plate for which an osmium film is formed by an experiment.

(Experiment Conditions)
Radio frequency output power density: 0.25 to 2.0 W/cm$^2$
Frequency of Radio frequency wave: 13.56 MHz
$OsO_4$ gas flow rate: 0.1 to 3 cc/min
$H_2$ gas flow rate: 5 to 15 cc/min
Ar gas flow rate: 5 to 15 cc/min
Pressure: 13 to 40 Pa
Film-forming time: 10 to 50 seconds
Heating temperature: 200 to 300° C.
Os film thickness: 10 to 50 nm (Experiment Results)
FIG. 7 schematically shows the aperture plate 107 for which an osmium film 110 is formed by the experiment, and is a cross-sectional view of the aperture plate cut in the vicinity of the through hole (second through hole) 107b of micro diameter (specifically 2 to 100 μm). As shown in FIG. 7, it was confirmed that, since the osmium film 110 was formed by a single film-forming treatment, an interface is not formed unlike the case of thin films formed by such conventional technique as the double film-forming treatment, and that the osmium film 110 can be formed on the inside surface of the through hole 107b of a micro diameter with good uniformity. As the result, the peeling of the osmium film 110 is suppressed, and the osmium film 110, that gives very good focusing properties of electron beams and has high resistance properties for electron beams to give long life, was formed for the through hole 107b of a micro diameter.

The invention claimed is:
1. A film-forming method of an osmium film comprising the steps of:
    disposing a metal plate in a chamber;
    introducing $OsO_4$ gas at a flow rate of 0.1 to 3 cc/min, $H_2$ gas at a flow rate of 5 to 15 cc/min and an inert gas for maintaining discharge into the chamber while maintaining the pressure in the chamber to 13 to 40 Pa; and
    forming an osmium film on the surface of the metal plate by turning the gas in the chamber into plasma using radio frequency output power with the density of 0.25 to 2.0 W/cm$^2$.

\* \* \* \* \*